(12) United States Patent
Park et al.

(10) Patent No.: US 9,587,797 B2
(45) Date of Patent: Mar. 7, 2017

(54) LIGHTING DEVICE

(71) Applicant: LG INNOTEK CO., LTD., Seoul (KR)

(72) Inventors: Moo Ryong Park, Seoul (KR); Chul Hong Kim, Seoul (KR); Kwang Ho Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 58 days.

(21) Appl. No.: 14/478,793

(22) Filed: Sep. 5, 2014

(65) Prior Publication Data

US 2014/0376233 A1    Dec. 25, 2014

Related U.S. Application Data

(63) Continuation of application No. 13/785,452, filed on Mar. 5, 2013, now Pat. No. 8,858,025.

(30) Foreign Application Priority Data

Mar. 7, 2012  (KR) .................. 10-2012-0023422
Mar. 7, 2012  (KR) .................. 10-2012-0023423
Mar. 7, 2012  (KR) .................. 10-2012-0023424

(51) Int. Cl.
*F21V 1/00* (2006.01)
*F21V 7/22* (2006.01)
(Continued)

(52) U.S. Cl.
CPC .............. *F21V 7/22* (2013.01); *F21S 48/212* (2013.01); *F21S 48/215* (2013.01);
(Continued)

(58) Field of Classification Search
CPC . F21V 5/02; F21V 5/004; F21V 13/04; F21Y 2101/02; H01L 2933/02; G02B 6/0088; H05K 1/189
(Continued)

(56) References Cited

U.S. PATENT DOCUMENTS 1,413,096 A * 4/1922 Cain ................... B60Q 1/2615
                                                    340/815.73
2005/0207164 A1* 9/2005 Holtz .................. F21S 48/1283
                                                    362/487
(Continued)

FOREIGN PATENT DOCUMENTS

CN   102128391 A   7/2011
CN   103392148 A   11/2013
(Continued)

OTHER PUBLICATIONS

Office Action dated Aug. 26, 2014 in Chinese Application No. 201310072265.8 filed on Mar. 7, 2013.
(Continued)

*Primary Examiner* — Ali Alavi
(74) *Attorney, Agent, or Firm* — Saliwanchik, Lloyd & Eisenschenk (57) ABSTRACT

Provided is a lighting device, including: a printed circuit board; one or more light emitting units formed on the printed circuit board; a resin layer which is formed on the printed circuit board, in which the light emitting units are embedded; a diffusion plate formed on an upper side of the resin layer, whereby an entire thickness of the lighting device can be reduced, and when the product is designed, a degree of freedom in design can be improved because flexibility is secured.

20 Claims, 9 Drawing Sheets

(51) Int. Cl.

| | | |
|---|---|---|
| *F21V 13/12* | (2006.01) | |
| *F21V 21/00* | (2006.01) | |
| *G02F 1/1335* | (2006.01) | |
| *H05K 1/18* | (2006.01) | |
| *H05K 3/38* | (2006.01) | |
| *F21S 8/10* | (2006.01) | |
| *H01L 25/075* | (2006.01) | |
| *H01L 33/44* | (2010.01) | |
| *H01L 33/60* | (2010.01) | |
| *F21V 8/00* | (2006.01) | |

(52) U.S. Cl.
CPC ....... *F21S 48/2243* (2013.01); *F21S 48/2268* (2013.01); *F21S 48/2281* (2013.01); *F21S 48/234* (2013.01); *F21S 48/238* (2013.01); *F21S 48/25* (2013.01); *F21V 13/12* (2013.01); *F21V 21/00* (2013.01); *G02B 6/0035* (2013.01); *G02B 6/0041* (2013.01); *G02F 1/133606* (2013.01); *H05K 1/185* (2013.01); *H05K 3/387* (2013.01); *F21S 48/22* (2013.01); *G02B 6/0021* (2013.01); *G02B 6/0051* (2013.01); *G02B 6/0073* (2013.01); *H01L 25/0753* (2013.01); *H01L 33/44* (2013.01); *H01L 33/60* (2013.01); *H01L 2924/0002* (2013.01); *H05K 2201/10106* (2013.01)

(58) Field of Classification Search
USPC .............................. 362/265, 257, 296.01, 307
See application file for complete search history.

(56) References Cited

U.S. PATENT DOCUMENTS

| | | |
|---|---|---|
| 2006/0285326 A1 | 12/2006 | Jeon |
| 2008/0266896 A1 | 10/2008 | Chang |
| 2011/0051411 A1* | 3/2011 | Kim .................. G02F 1/133603 362/235 |
| 2011/0051412 A1 | 3/2011 | Jeong et al. |
| 2011/0242796 A1 | 10/2011 | Yang et al. |
| 2013/0328090 A1* | 12/2013 | Park ........................ H01L 33/60 257/98 |
| 2013/0335975 A1* | 12/2013 | Park ........................ F21V 13/02 362/297 |
| 2014/0043819 A1* | 2/2014 | Yang .................... G02B 6/0088 362/268 |
| 2014/0043854 A1* | 2/2014 | Yang ....................... F21V 13/12 362/612 |

FOREIGN PATENT DOCUMENTS

| | | |
|---|---|---|
| JP | H05-050431 U | 7/1993 |
| JP | 2004-055430 A | 2/2004 |
| JP | 2009-080993 A | 4/2009 |
| JP | 2009-081089 A | 4/2009 |
| JP | 2009-122420 A | 6/2009 |
| JP | 2009-193955 A | 8/2009 |
| JP | 2009-239022 A | 10/2009 |
| JP | 2011-044425 A | 3/2011 |
| JP | 2011-142079 A | 7/2011 |
| KR | 1020090001104 A | 1/2009 |
| KR | 1020110104398 A | 9/2011 |
| KR | 1020110104401 A | 9/2011 |
| KR | 10-2012-0004222 A | 1/2012 |
| KR | 1020120003271 A | 1/2012 |
| KR | 1020120003272 A | 1/2012 |
| KR | 1020120003273 A | 1/2012 |
| KR | 10-2012-0009209 A | 2/2012 |
| WO | WO-2011/056026 A2 | 5/2011 |

OTHER PUBLICATIONS

Partial European Search dated Mar. 15, 2016 Report in European Application No. 13158080.5.

* cited by examiner

LIGHTING DEVICE

CROSS-REFERENCE TO RELATED APPLICATIONS

This application is a continuation of U.S. application Ser. No. 13/785,452, filed Mar. 5, 2013, which claims the benefit under 35 U.S.C. §119 of Korean Patent Application Nos. 10-2012-0023422, 10-2012-0023423, and 10-2012-0023424, filed Mar. 7, 2012, all of which are herein incorporated by reference in their entirety.

BACKGROUND

Field of the Invention

The present invention relates to a technical field of a lighting device, and more specifically, to a structure of a lighting device which enables an entire thickness to get thinner and can secure light efficiency.

Description of the Related Arts

An LED (Light Emitted Diode) device is a device which converts an electrical signal to infrared rays or light using a composition semiconductor property. Unlike a fluorescent lamp, since the LED device does not use harmful substances such as mercury and the like, it has a low possibility to cause environmental pollution and a long life span compared to a conventional light source. Also, it is advantageous that the LED device spends low electricity compared to the conventional light source and has excellent visibility and low brilliantness due to a high color temperature.

Accordingly, a current lighting device has been developed from a structure, in which a traditional light source such as a conventional incandescent lamp or a fluorescent lamp is used, to a structure, in which the aforesaid LED device is used as a light source. In particular, by using a light guide plate as disclosed in Korean Laid-Open Patent Publication No. 10-2012-0009209, the lighting device which performs a surface light-emitting function has been provided.

Figure 1:
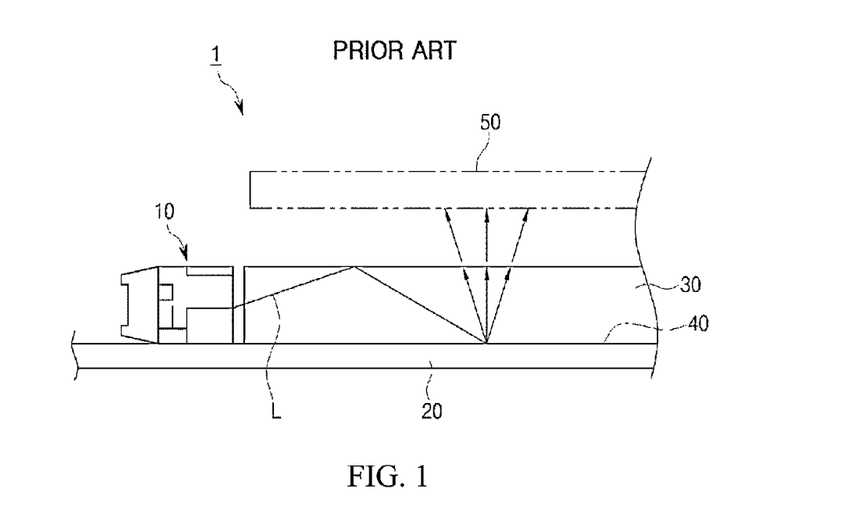
FIG. 1 and FIG. 2 schematically illustrate a structure of a conventional light device.
Figure 2:
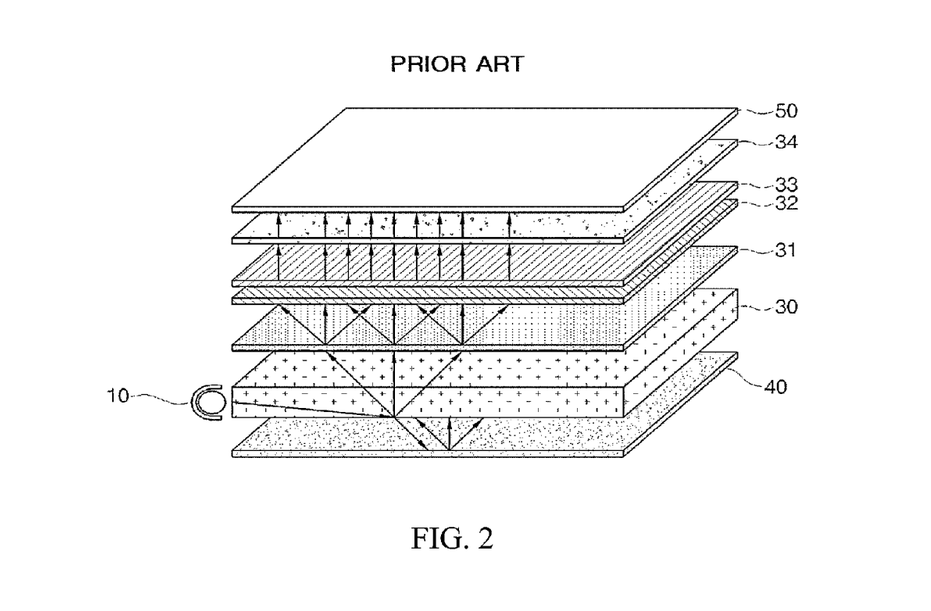

FIG. 1 and FIG. 2 schematically illustrate a conventional lighting device 1 which performs a surface light-emitting function. Referring to FIG. 1 and FIG. 2, the conventional lighting device 1 is configured such that a flat light guide plate 30 is disposed on a substrate 20, and a plurality of side view type LEDs 10 (only one LED being illustrated in the drawings) are disposed on a side of the light guide plate 30 in an array shape.

Light (L) incident to the light guide plate 30 from the LEDs 10 is reflected to an upper part by a minute reflection pattern or a reflection sheet 40 which is provided onto a bottom surface of the light guide plate 30 and is emitted from the light guide plate 30. Then, the light is emitted to the upper part of the light guide plate 30 and thus is provided to the outside through an external housing 50 made of a transparent material. Like the conceptual view as illustrated in FIG. 2, the lighting device 1 may be configured such that a plurality of optical sheets such as a diffusion sheet 31, prism sheets 32, 33, a protective sheet 34 and the like are further added between the light guide plate 30 and the external housing 50.

The aforesaid lighting device 1 functions to uniformly supply light to the outside. The light guide plate 30 is a component which functions to improve brightness of the light device 1 and to uniformly supply light. Also it is a kind of plastic mold lens to uniformly transmit the light emitted from a light source (LED). Accordingly, the light guide plate 30 is elementally used as an essential component of the conventional lighting device 1, but, due to a thickness of the light guide plate 30 itself, there is a limitation to make the thickness of an entire product thinner. As a material of the light guide plate 30 is not flexible, it is disadvantageous that it would be difficult to apply the light guide plate to the external housing 50, and thus a product plan and design cannot be easily changed.

Also, as the light is emitted from the side of the light guide plate to the outside, light loss is generated, thereby reducing light efficiency and brightness of the lighting device.

Moreover, because the LED which is a point light source is used, even though it is changed to a surface light source, there is a limitation to embody various lighting designs.

PRIOR ART REFERENCE

Patent Reference

Korean Laid-Open Patent Publication No. 10-2012-0009209

BRIEF SUMMARY

The present invention has been made keeping in mind the above problems occurring in the related art. An aspect of the present invention provides a structure of a lighting device, which is configured such that a resin layer instead of a light guide plate is used to guide light emitted from a light emitting unit to the outside, thereby enabling an entire thickness of the lighting device to get thinner.

Another aspect of the present invention provides a structure of a lighting device, which can secure reliability while improving a degree of freedom in product design as the lighting device itself has flexibility.

Still another aspect of the present invention provides a structure of a lighting device which is configured such that a light reflection unit is disposed on a side of a resin layer so that light loss generated from the side of the resin layer can be minimized, and light efficiency can be improved.

Also, still another aspect of the present invention provides a lighting device, which is configured such that such that an indirect radiation unit is formed on a side of a surface light-emitting unit so that a flare effect can be generated, thereby realizing design differentiation of the lighting device.

According to an aspect of the present invention, there is provided a lighting device including: a printed circuit board; one or more light emitting units formed on the printed circuit board; a resin layer which is formed on the printed circuit board, and in which the light emitting unit is embedded; and a diffusion plate formed on an upper side of the resin layer.

According to the present invention, it is advantageous that the number of light emitting units can be reduced and an entire thickness of the lighting device can be thinner by removing the light guide plate and guiding light using the resin layer.

According to the present invention, the lighting device is formed using the flexible printed circuit board and the resin layer so that flexibility can be secured and a degree of freedom in product design can be improved.

Moreover, according to the present invention, it is advantageous that the reflectance of light can be improved, the improvement of brightness can be maximized, and a uniform surface light source can be provided because the reflection member and the reflection pattern, which are structures capable of efficiently reflecting the light emitted from the light emitting units, are provided.

Also, according to the present invention, because the first optical substrate or the second optical substrate having the optical pattern is formed such that the air gap is provided in the adhesive layer, a hot spot and a dark space can be inhibited from being generated from the light shielding pattern, and the reliability of components adhered to the adhesive layer can be secured. Also, it is advantageous that the lighting device without a significant difference between optical properties can be realized, and it would be possible to accurately align the components.

Also, according to the present invention, light loss can be minimized because the light reflection unit is provided, thereby improving brightness and illuminance of the lighting device.

Also, according to the present invention, it is advantageous that various lighting effects using a flare phenomenon can be realized and the lighting devices of various designs can be implemented because the indirect radiation unit for reflecting light to the side of the surface light-emitting unit is disposed.

Also, according to the present invention, it is advantageous that a soft illumination effect can be realized without a separate light emitting unit because the illumination effect is realized using light emitted to the side of the resin layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Exemplary embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. It is to be understood that the form of the present invention shown and described herein is to be taken as a preferred embodiment of the present invention and that various changes and modifications may be made in the invention without departing from the spirit and scope thereof. Also, in the following description, it is to be noted that, when the functions of conventional elements and the detailed description of elements related with the present invention may make the gist of the present invention unclear, a detailed description of those elements will be omitted. Reference will now be made in greater detail to a preferred embodiment of the invention, an example of which is illustrated in the accompanying drawings. Wherever possible, the same reference numerals will be used throughout the drawings and the description to refer to the same or like parts.

The present invention relates to a lighting device using an LED, which is a light emitting unit, as a light source. The gist of the present invention is to provide a structure of a lighting device, which can innovatively reduce an entire thickness of the lighting device by removing a light guide plate and replacing it with a resin layer, and can also secure flexibility and reduce the number of light sources.

Moreover, the lighting device according to the present invention can be applied to various lamp devices such as a lamp for vehicles, a lighting device for home use and a lighting device for industrial purpose, which require illumination. For example, in a case where the lighting device is applied to the lamp for vehicles, it can be also applied to headlights, car indoor illumination, door scuff, backlight and the like. Additionally, the lighting device according to the present invention can be applied to the field of a backlight unit applied to a liquid crystal display device. In addition to this, the lighting device can be applied to illumination related all fields which have been developed and commercialized or can be implemented according to future technical development.

Figure 3:
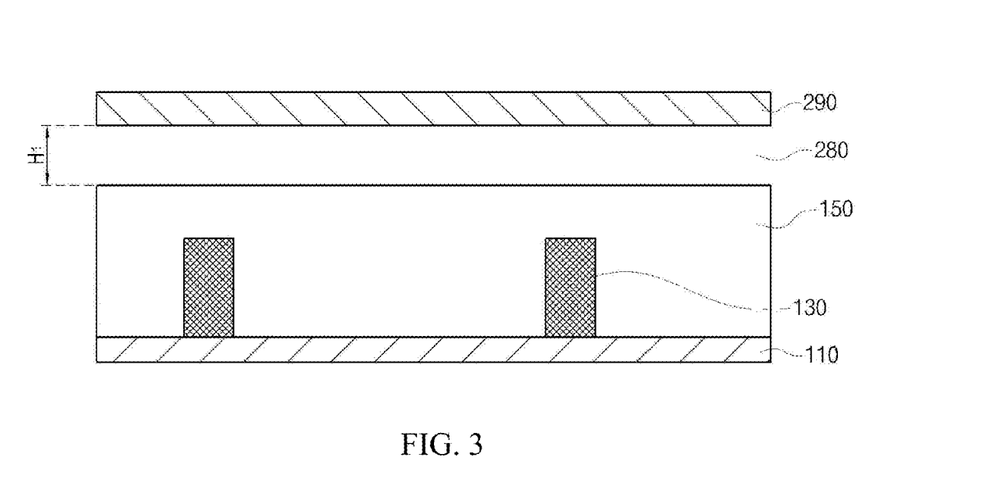
FIG. 3 illustrates the subject matter of a lighting device according to the present invention.

FIG. 3 illustrates the subject matter of a lighting device according to the present invention.

Referring to FIG. 3, a lighting device according to the present invention includes: a printed circuit board 110; one or more light emitting units 130 formed on the printed circuit board 110; a resin layer 150 which is formed on the light emitting units 130 so that the light emitting units 130 is embedded in the resin layer, and which guides emitted light to a diffusion plate 290; and the diffusion plate 290 which uniformly diffuses incident light and emits the light to the outside. Furthermore, a prism sheet and a protective sheet may be further provided into an upper part or a lower part of the diffusion plate 290, even though this is not illustrated in the drawing.

The printed circuit board 110 means a board in which a circuit pattern is formed on a substrate, namely, a PCB. In particular, in the present invention, it would be preferable that the printed circuit board is formed as a flexible printed circuit board (FPCB) to secure uniform flexibility.

The light emitting units 130 are configured such that one or more light emitting units are arranged on the printed circuit board 110, thereby emitting light. The light emitting units 130 of the present invention may be composed of side view type light emitting diodes. That is, a light emitting diode having a structure in which emitted light is emitted in a lateral direction rather than going straight up may be used as the light emitting units 130 of the present invention. Thus, the lighting device according to the present invention is configured such that the light emitting units 130 composed of the side view type light emitting diodes are disposed in a direct type, and the resin layer which functions to diffuse and reflect light is utilized so that the light is diffused and guided in a direction of the diffusion plate 290, thereby reducing the number of light emitting units and innovatively reducing an entire weight and thickness of the lighting device.

The resin layer 150 is formed in an upper part of the light emitting units 130 and the printed circuit board 110. The resin layer 150 diffuses and guides light emitted from the light emitting units 130 forward. That is, the resin layer 150 is formed in a structure in which the light emitting units are embedded, thereby functioning to diffuse the light emitted from the light emitting units 130 to a lateral direction. That is, the resin layer 150 may perform the function of a conventional tight guide plate.

The resin layer 150 of the present invention may be basically composed of a material which can diffuse tight. For example, the resin layer 150 of the present invention may be composed of a ultraviolet curing resin including a oligomer. More specifically, the resin layer 150 may be formed using resin which has a urethane acrylate oligomer as a main raw material. For example, resin in which the urethane acrylate oligomer which is a synthetic oligomer is mixed with a polymer type which is polyacryl may be used. Of course, a monomer in which IBOA (isobornyl acrylate), HPA (Hydroxylpropyl acrylate, 2-HEA(2-hydroxyethyl acrylate), which are low boiling point and diluted type reactive monomers, are mixed may be further included. A photo initiator (e.g. 1-hydroxycyclohexyl phenyl-ketone and the like) or an antioxidant may be mixed as an additive. However, the aforesaid contents are only one example. In addition to this, the resin layer 150 of the present invention may be formed of all resins which have been developed and commercialized or can be embodied according to future technical development, and can perform the function to diffuse light.

According to the present invention, thanks to the existence of the resin layer 150, the thickness occupied by the conventional light guide plate can be innovatively reduced, and the entire product can be made thinner. Also, because the lighting device has flexibility, it may be easily applied to a curved surface and a degree of freedom in product design may be improved. Furthermore, the lighting device may be applied to other flexible display devices.

The diffusion plate 290 is formed in an upper part of the resin layer 150 and functions to uniformly diffuse light emitted through the resin layer 150 all over the surface. The diffusion plate 290 may be generally formed of actyl resin. However, the present invention is not limited to this. In addition to the acryl resin, the diffusion plate 290 may be formed of all materials of high transmission plastic such as poly-styrene (PS), poly(methyl methacrylate) (PMMA), cyclic olefin copolymers (COC), polyethylene terephthalate (PET), resin, which can perform the diffusion function.

At this time, an air layer (i.e. a first air gap 280) may be further formed between the diffusion plate 290 and the resin layer 150. Thanks to the existence of the first air gap 280, the uniformity of light supplied to the diffusion plate 290 may be increased. As a result, the uniformity of light diffused and emitted through the diffusion plate 290 can be improved. At this time, to minimize the deviation of light which transmits the resin layer 150, a thickness H1 of the first air gap 280 may be formed in a range of 0 to 20 mm. However, the present invention is not limited to this. The thickness may be appropriately changed as necessary.

Figure 4:
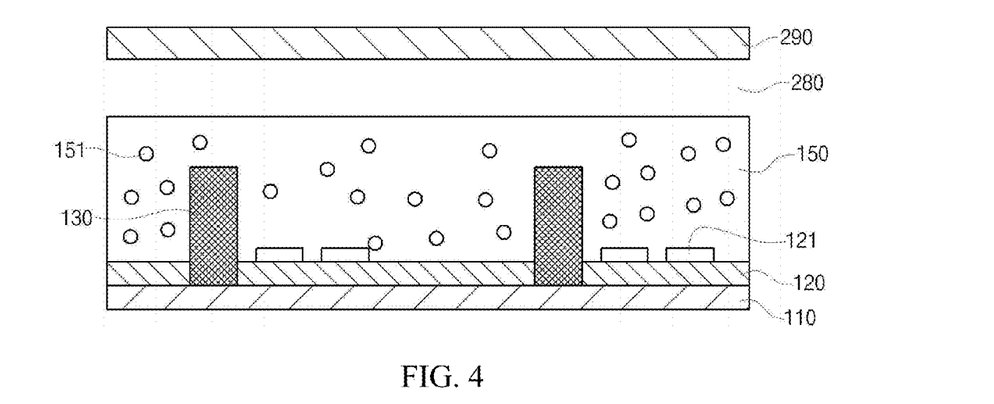
FIG. 4 illustrates a structure in which a bead and a reflection member are added to the lighting device of the present invention as illustrated in FIG. 3.

FIG. 4 illustrates a structure in which a bead and a reflection member are added to the lighting device of the present invention as illustrated in FIG. 3.

Referring to FIG. 3 and FIG. 4, the resin layer 150 of the present invention may further include a plurality of beads 151 in a shape in which the beads having a hollow (or an air-void) formed in an inner part thereof are mixed and diffused. The beads 151 function to improve light reflection and diffusion properties. For example, when light emitted from the light emitting units 130 is incident to the beads 151 of an inner part of the resin layer 151, the light is reflected and transmitted by the hollow of the beads 151, and thus is diffused and concentrated. The light is then emitted to the diffusion plate 290. At this time, a reflection and diffusion rate of the light are increased by the beads 151, so that an amount and uniformity of the emitted light supplied to the diffusion plate 290 later are improved. As a result, brightness of the lighting device can be improved.

A content of the beads 151 may be appropriately adjusted to obtain a desired light diffusion effect. More specifically, the content of the beads may be adjusted in a range of 0.01 to 0.3% based on a total weight of the resin layer. However, the present invention is not limited to this. That is, the light emitted from the light emitting unit 130 in a side direction is diffused and reflected through the resin layer 150 and the beads 151 so as to travel in an upper direction. The beads 151 may be formed of any one selected from silicon, silica, glass bubble, PMMA, urethane, Zn, Zr, $Al_2O_3$, and acryl. A diameter of the beads 151 may be formed in a range of 1 μm to 20 μm. However, the present invention is not limited to this.

A reflection member 120 of the present invention is formed on an upper surface of the printed circuit board 110 and has a structure in which the light emitting units 130 are formed to pass through the reflection member 120. The reflection member 120 according to the present invention is formed of a material having high reflection efficiency, thereby enabling light loss to be reduced. The reflection member 120 may be formed in a film shape and may include a synthetic resin in which a white pigment is diffused and contained so that light reflection and diffusion properties can be realized. For example, titanium oxide, aluminum oxide, zinc oxide, lead carbonate, barium sulfate, calcium carbonate and the like may be used as the white pigment. Polyethylene terephthalate, polyethylene naphtaenate, acryl resin, poly carbonate, polystyrene, polyolefin, cellulose acetate, weather resistant vinyl chloride and the like may be used as the synthetic resin. However, the present invention is not limited to this.

The reflection pattern 121 may be formed on a surface of the reflection member 120. The reflection pattern 121 functions to uniformly transmit light to the diffusion plate 290 by scattering and diffusing the incident light. The reflection pattern 121 may be formed in such a manner that the reflection pattern 121 is printed on a surface of the reflection member 120 using a reflective ink including any one of $TiO_2$, $CaCO_3$, $BaSO_4$, $Al_2O_3$, Silicon and PS. However, the present invention is not limited to this. Also, the reflection pattern 121 may have a structure having a plurality of protruding patterns and may be formed in a prism shape, a lenticular shape, a lens shape or a combination shape thereof to improve a light scattering effect. However, the shape is not limited. Also, a cross-sectional shape of the reflection pattern 121 may be formed in a structure having various shapes such as a triangular shape, a quadrangular shape, a semi-circular shape, a sinusoidal shape and the like.

Figure 5:
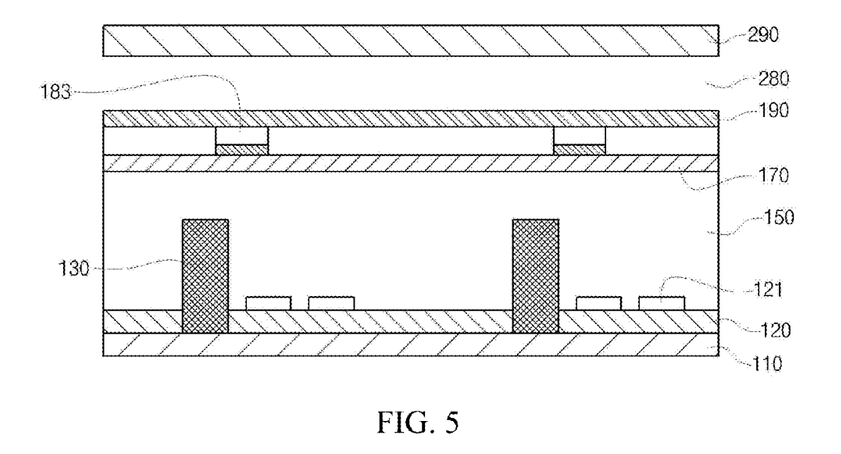
FIG. 5 illustrates a structure in which the reflection member and an optical sheet are added to the lighting device of the present invention as illustrated in FIG. 3.

FIG. 5 illustrates a structure in which the reflection member and an optical sheet are added to the lighting device of the present invention as illustrated in FIG. 3.

Referring FIG. 3 to FIG. 5, the lighting device of the present invention may further include: a first optical sheet 170 formed on an upper surface of the resin layer 150; and a second optical sheet 190 formed on the first optical sheet 170. Also, an optical pattern 183 may be further formed on an upper surface of the first optical sheet 170 or a lower surface of the second optical sheet 190. One or more optical sheets may be additionally formed on the second optical sheet 190.

The optical pattern 183 formed on the upper surface of the first optical sheet 170 or the lower surface of the second optical sheet 190 may be formed as a light shielding pattern formed to inhibit the concentration of light emitted from the light emitting unit 130. For this, it is required to align between the optical pattern 183 and the light emitting unit 130. At this time, to secure fixing strength after performing the aligning, the first optical sheet 170 and the second optical sheet 190 are adhered to each other using an adhesive layer which will be explained hereinafter.

The first optical sheet 170 and the second optical sheet 190 may be formed using a material having excellent light transmission. As one example, PET may be used.

The optical pattern 183 disposed between the first optical sheet 170 and the second optical sheet 190 basically functions to inhibit the concentration of light emitted from the light emitting unit 130. The optical pattern 183 may be formed as a light shielding pattern so that a light shielding effect can be realized in a predetermined part to inhibit a phenomenon in which an optical property is deteriorated or yellowish light is generated due to excessively strong light strength. The light shielding pattern may be formed by performing a printing process to the upper surface of the first optical sheet 170 and the lower surface of the second optical sheet 190 using a light shielding ink.

The optical pattern 183 may be realized as one optical pattern so as to perform the function to partially shield and diffuse light rather than the function to completely shield the light and adjust a light shielding and diffusing degree. Furthermore, more specifically, the optical pattern 183 according to the present invention may be realized in an overlapping print structure of complex patterns. The overlapping print structure means a structure which is implemented by forming one pattern and printing another pattern shape on an upper part thereof.

As one example, the optical pattern 183 may be implemented in a structure in which the diffusion pattern formed on a lower surface of a polymer film in a light emitting direction using a light shielding ink including one or more materials selected from $TiO_2$, $CaCO_3$, $BaSO_4$, $Al_2O_3$ and Silicon overlaps with the light shielding pattern formed using a light shielding ink including Al or a mixture of Al and $TiO_2$. That is, the diffusion pattern is formed on the surface of the polymer film by performing a white printing process, and thereafter, the light shield pattern is formed thereon. In reverse, the patterns may be formed in a double structure. Of course, it would be obvious that the formation design of the patterns may be variously changed in consideration of the efficiency and strength of light and a shading ratio. Also, the patterns may be formed in such a tripe structure that in a sequential laminated structure, the light shielding pattern, which is a metal pattern, is formed in a middle layer, and diffusion patterns are implemented, respectively in an upper part and a lower part thereof. In this triple structure, the patterns may be implemented by selecting the aforesaid materials. As one preferred example, based on the triple structure in which one diffusion pattern of diffusion patterns is implemented using $TiO_2$ having excellent reflectance, another diffusion pattern is implemented using $CaCO_3$ and $TiO_2$ together having excellent safety and color sense, and the light shielding pattern is implemented using Al having excellent hiding power, the efficiency and uniformity of light can be secured. In particular, $CaCO_3$ functions to decrease the exposure of yellowish light, and thus functions to finally implement white light, so that the more stable efficiency of light can be implemented. In addition to $CaCO_3$, inorganic materials having a large particle size and a similar structure such as $BaSO_4$, $Al_2O_3$ and Silicon beads and the like may be utilized. Moreover, in view of the efficiency of light, it would be preferable that the optical pattern 183 is formed by adjusting a pattern density in such a manner that the pattern density is reduced as the optical pattern is moved far from the light emitting direction of the LED light source.

Figure 6:
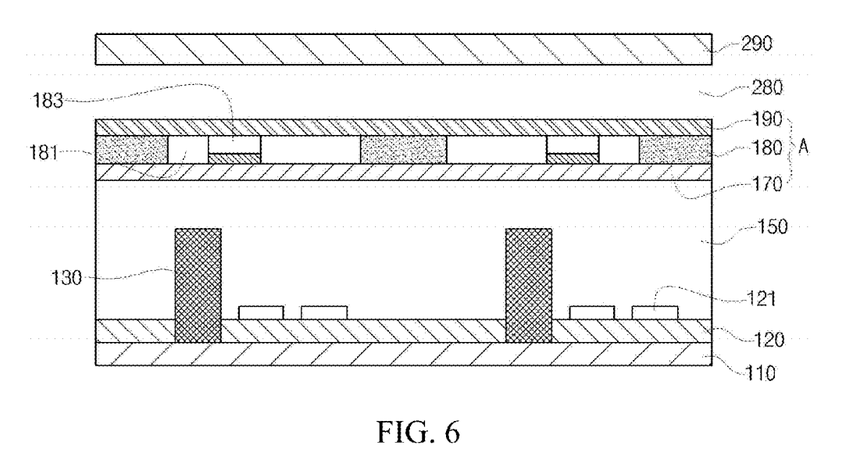
FIG. 6 illustrates a structure in which an adhesive layer is formed in the lighting device of the present invention as illustrated in FIG. 5.

FIG. 6 illustrates a structure in which an adhesive layer is formed in the lighting device of the present invention as illustrated in FIG. 5.

Referring to FIG. 3 to FIG. 6, the lighting device of the present invention may further include an adhesive layer 180 formed between the first optical sheet 170 and the second optical sheet 190. A second air gap 181 may be further formed on the adhesive layer 180. That is, the adhesive layer 180 forms a spaced space (the second air gap 181) around the optical pattern 183. By applying an adhesive material to remaining parts, the adhesive layer 180 may be implemented in a structure in which the first optical sheet 170 and the second optical sheet 190 are adhered to each other. Also, one or more optical sheets may be additionally formed on the second optical sheet 190. The structure including the first optical sheet 170, the second optical sheet 190, the adhesive layer 180 and the optical pattern 183 may be defined as an optical pattern layer A.

The adhesive layer 180 may formed in a structure which the adhesive layer surrounds around the optical pattern 183, and the second air gap 181 is formed in the remaining parts or a structure in which the second air gap 181 is formed around the optical pattern 183. Thus, it may be realized to align it by bonding the two optical sheets to each other. That is, a bonding structure of the first optical sheet 170 and the second optical sheet 190 may function to fix the printed optical pattern 183.

At this time, the adhesive layer 180 may be formed using a thermosetting PSA, a thermosetting adhesive, UV curing PSA type materials. However, the present invention is not limited to this.

At this time, the first air gap 280 as set forth in the explanation of FIG. 3 may be formed between the second optical sheet 190 and the diffusion plate 170. Thanks to the existence of the first air gap 280, the uniformity of light supplied to the diffusion plate 290 may increase. As a result, the uniformity of light which is diffused and emitted through the diffusion plate 290 may be improved. At this time, to minimize the deviation of light which transmits the resin layer 150, a thickness of the first air gap 280 may be formed in a range of exceeding 0 but not exceeding 20 mm. However, the thickness is not limited to this. As described in the explanation of FIG. 3, the thickness may be appropriately designed and changed as needed.

Also, as described above, one or more optical sheets may be additionally formed on the optical pattern layer (A) as necessary, even though this is not illustrated.

Figure 7:
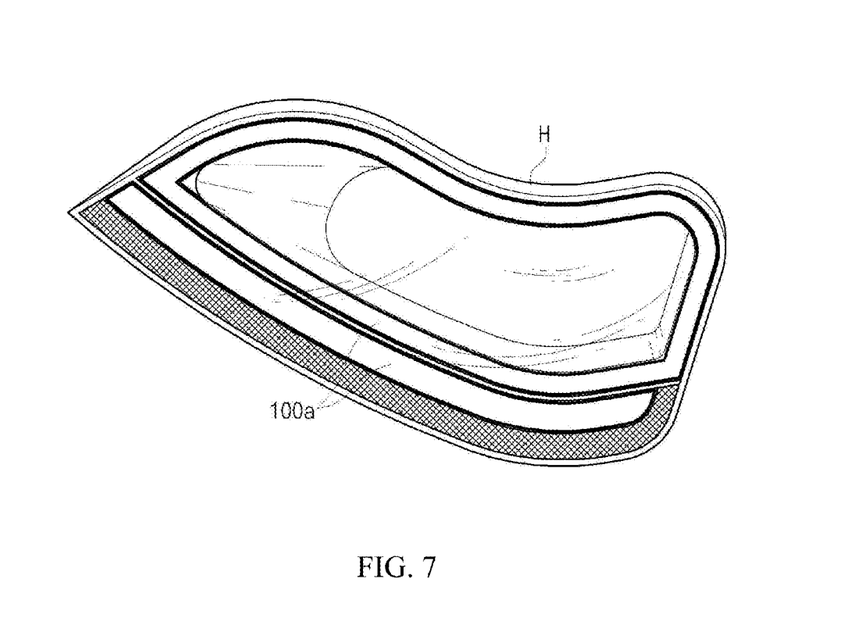
FIG. 7 schematically illustrates a structure in which the lighting device according to the present invention is applied to a headlight for vehicles.
Figure 8:
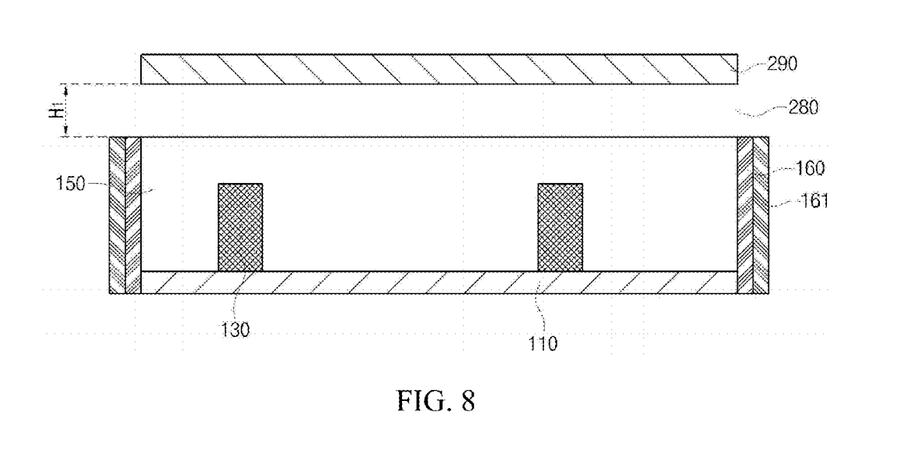
FIG. 8 through FIG. 11 illustrate a structure in which a light reflection unit is added to the lighting device of the present invention as illustrated in FIG. 3 through FIG. 6.
Figure 9:
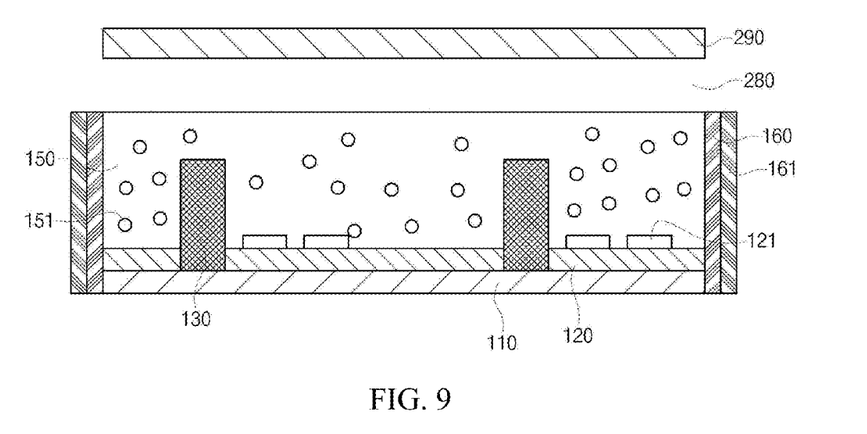
Figure 10:
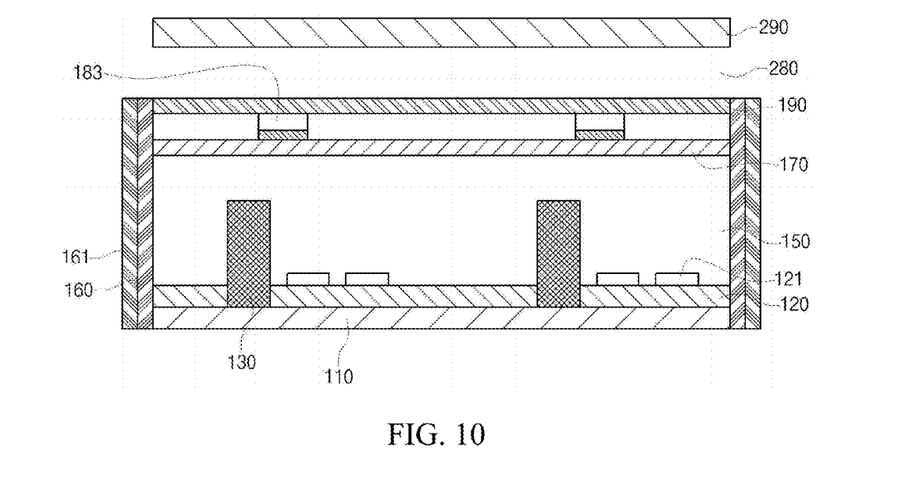
Figure 11:
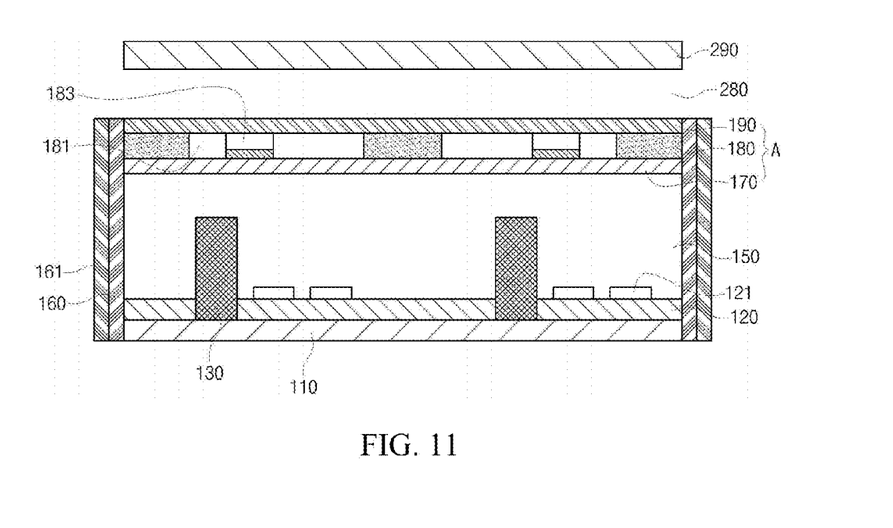

FIG. 7 schematically illustrates a structure in which the lighting device according to the present invention is applied to a headlight for vehicles.

Referring to FIG. 7, a lighting device 100a according to the present invention is formed using a flexible printed circuit board and a resin layer. The lighting device itself has flexibility. Accordingly, as illustrated in FIG. 7, the lighting device may be easily mounted to a headlight housing for vehicles H in which flexure is formed. Thus, a degree of freedom in design of a complete product combined with the housing may be improved. In spite of the improvement of the degree of freedom in design, uniform brightness and illuminance may be also secured. Meanwhile, FIG. 7 shows that the lighting device as illustrated in FIG. 3 is mounted. However, this is only one example. The lighting devices as illustrated in FIG. 4 to FIG. 6 may be mounted.

FIG. 8 through FIG. 11 illustrate a structure in which a light reflection unit and a light reflection unit supporting unit are added to the lighting device of the present invention as illustrated in FIG. 3 through FIG. 6.

Referring to FIG. 8 through FIG. 11, the lighting device according to the present invention may further include a light reflection unit 160 which is disposed on any one of one side and another side of the resin layer 150. The light reflection unit 160 guides so that light emitted from the light emitting unit 120 is emitted to an upper part, and performs a guide function to inhibit the light from be emitted to the outside through a side of the resin layer 150. The light reflection unit 160 may be composed of a white resist which is a material having excellent light reflectance. Additionally, the light reflection unit may be composed of a synthetic resin in which a white pigment is diffused and contained, or a synthetic resin in which metal particles having an excellent light reflection property are diffused. At this time, titanium oxide, aluminum oxide, zinc oxide, lead carbonate, barium sulfate, calcium carbonate and the like may be used as the white pigment. In a case where metal powders are included, Ag powders having excellent reflectance may be included. Also, a separate fluorescent whitening agent may be additionally included. That is, the light reflection unit 160 according to the present invention may be formed using all materials having excellent light reflectance, which have been developed or can be implemented according to future technical development.

Meanwhile, the light reflection unit 160 may be directly molded and connected to the side of the resin layer 150 or may be adhered thereto using a separate adhesive material (or an adhesive tape).

Moreover, the light reflection unit 160 may be connected to the resin layer 150 using a separate a light reflection unit supporting unit 161.

According to this, as the light reflection unit 160 is formed on the side of the resin layer 150, light bleeding may be inhibited from being generated in the side of the resin layer 150, thereby reducing light loss and increasing light efficiency. Furthermore, brightness and illuminance of the lighting device may be improved in comparison of equal electricity. Also, the light emitting units 130 and the resin layer 150 may be safely sealed by further forming the light reflection unit supporting unit 161 on the outer surface of the light reflection unit 160, thereby improving durability and reliability of the lighting device.

Figure 12:
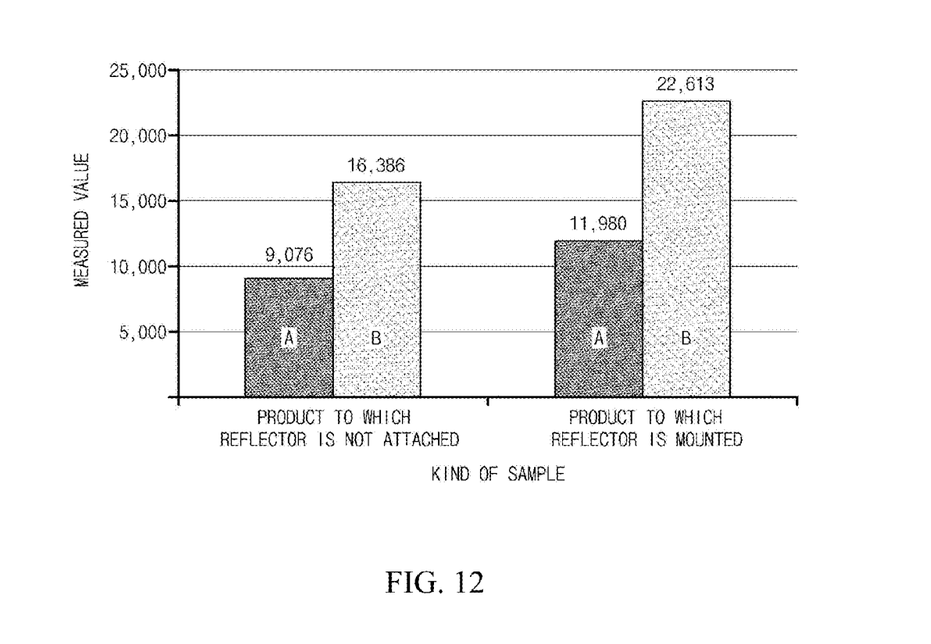
FIG. 12 is a graph illustrating the measurement results of brightness and illuminance based on whether or not the light reflection unit is included.

FIG. 12 is a graph illustrating the measurement results of brightness and illuminance based on whether or not a light reflection unit is included. Graph A represents brightness (nit), and graph B represents illuminance (lux). Referring to FIG. 6, compared to the lighting device having a structure in which the light reflection unit is not mounted, it can be confirmed that the lighting device having the light reflection unit of the present invention shows the improvement of brightness and illuminance in the range of about 30 to 40%. Thus, according to the reduction in light loss, light efficiency is improved. Furthermore, it can be confirmed that even though the number of the light emitting units is reduced, the same brightness and illuminance is implemented.

Figure 13:
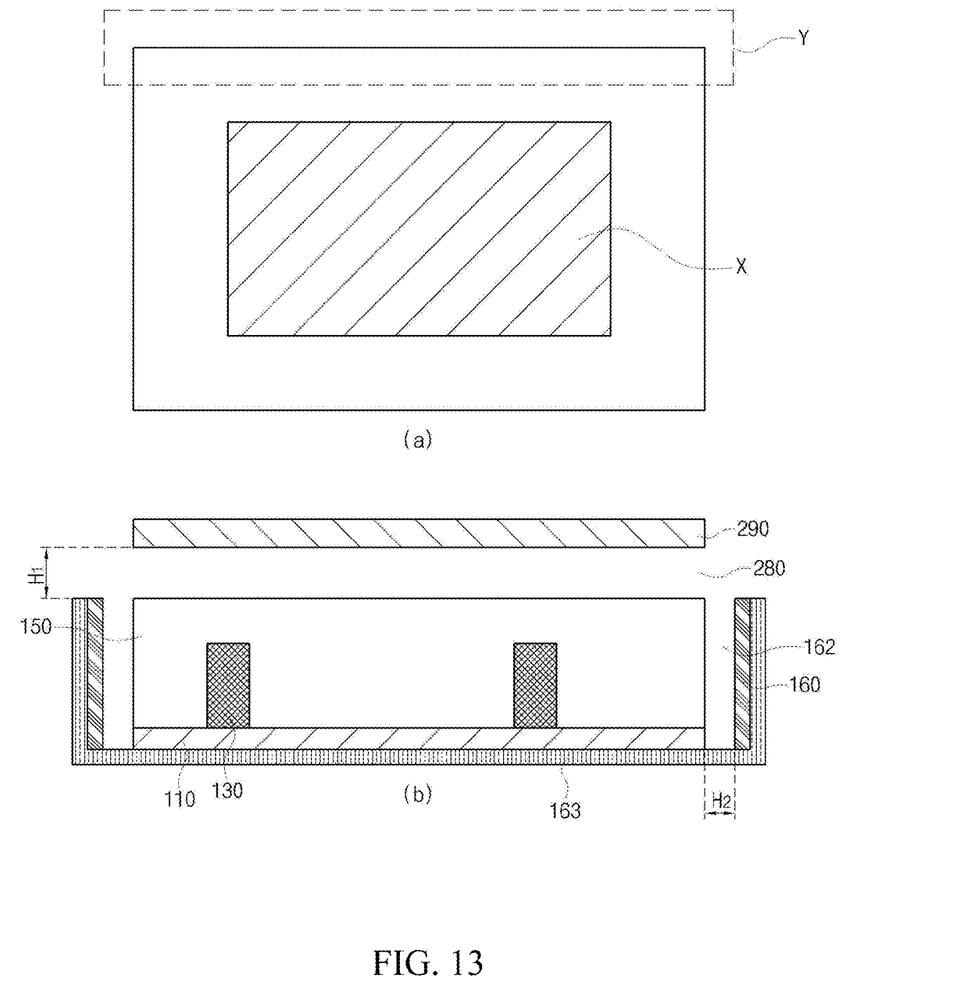
FIG. 13 through FIG. 16 illustrate a structure in which an indirect radiation unit is added to the lighting device of the present invention as illustrated in FIG. 3 through FIG. 6.
Figure 14:
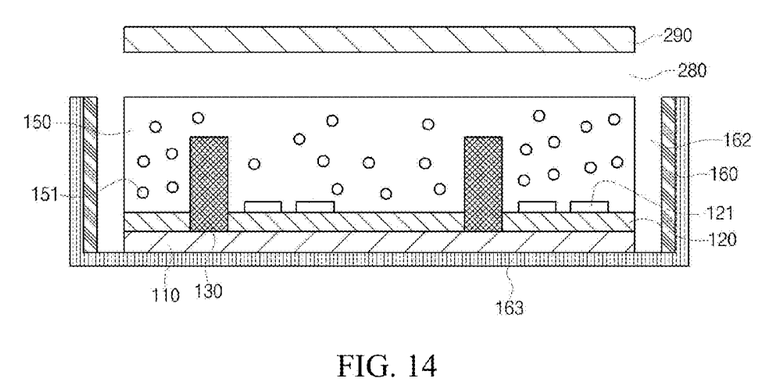
Figure 15:
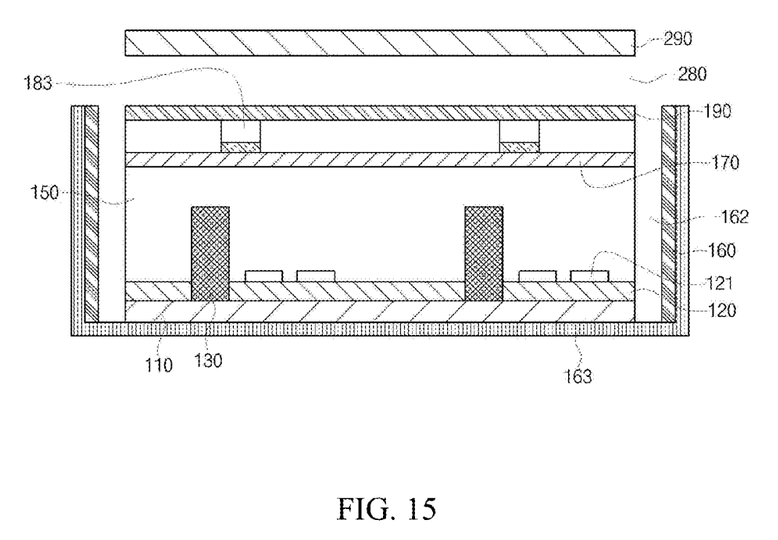
Figure 16:
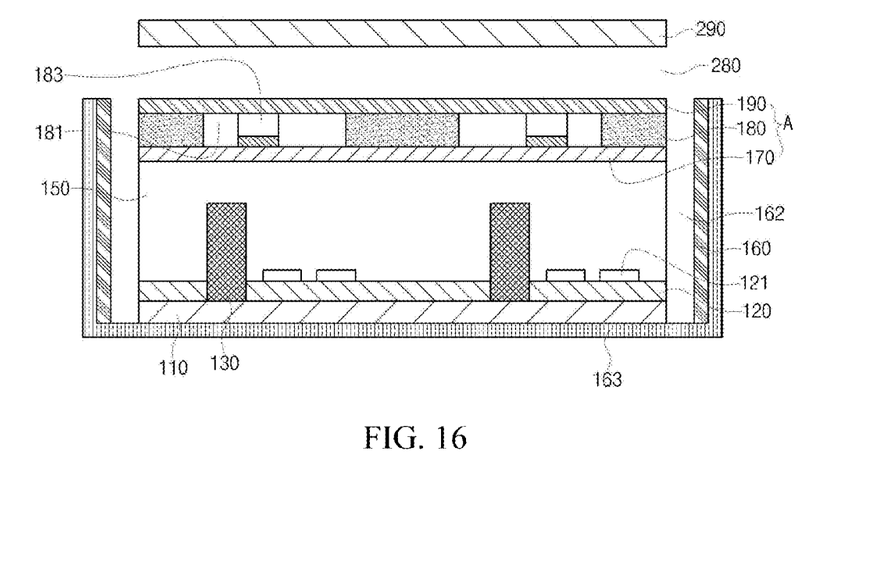

FIG. 13 through FIG. 16 illustrate a structure in which an indirect radiation unit is added to the lighting device of the present invention as illustrated in FIG. 3 through FIG. 6. In particular, (a) of FIG. 13 illustrates a plane view of the lighting device and (b) of FIG. 13 illustrates a cross-sectional side view of the lighting device in which the indirect radiation unit is added to FIG. 3.

For an easy explanation, the lighting device as illustrated in FIG. 3 to FIG. 6 will be hereinafter referred to as a surface light-emitting unit X.

Referring to FIG. 13 to FIG. 16, the lighting device according to the present invention is composed of the surface light-emitting unit X and the indirect radiation unit Y formed on a side of the surface tight-emitting unit X. Here, the surface light-emitting unit X is the lighting devices as illustrated in FIG. 3 to FIG. 6, and is a part which converts light irradiated from the light emitting unit to a surface light source and emits the light to the outside. Also, the indirect radiation unit Y is a part which implements a light leak effect (or a flare effect) by reflecting the light irradiated from the tight emitting unit of the surface light-emitting unit X and generating reflection tight. Meanwhile, (a) of FIG. 13 illustrates that the indirect radiation unit Y is formed on the entire side of the surface light-emitting unit X. However, this is only one example. The indirect radiation unit may be formed only on a part of the side of the surface light-emitting unit X.

Since the configuration of the surface light-emitting unit X is identical with that of the lighting device of FIG. 3 to FIG. 6 as described above, the explanation thereon is omitted.

The configuration of the indirect radiation unit Y is composed of the light reflection unit 161 formed on the side of the surface light-emitting unit X. The light reflection unit 160 may be formed to be spaced apart from the surface light-emitting unit X, more specifically, the resin layer 150 of the surface light-emitting unit X in a predetermined distance. Hereinafter, a spaced space between the surface light-emitting unit X and the light reflection unit 160 is defined as an indirect radiation air gap 162.

When light emitted from the light emitting unit 130 is emitted through a side of the resin layer 150, the light reflection unit 160 reflects the emitted light, thereby forming reflection light (or indirect light). Thus, the light which is lost at the lighting device is again reflected by the light reflection unit 160, so a flare phenomenon in which light softly spreads is generated. Also, by using the phenomenon, various illumination effects which can be applied to indoor and outdoor interiors and car illumination may be realized.

Meanwhile, to maximize the aforesaid flare phenomenon, the indirect radiation air gap 162 may be further formed between the light reflection unit 160 and the surface light-emitting unit X. Thus, the light emitted to the side of the resin layer 150 is scattered at the indirect radiation air gap 162, and the scattered light is again reflected by the light reflection unit 160, thereby maximizing the flare phenomenon.

The light reflection unit 160 may be composed of a material having excellent light reflectance, namely, a white resist. In addition to this, the light reflection unit 160 may be composed of a synthetic resin in which a white pigment is diffused and contained, or a synthetic resin in which a metal particle having an excellent light reflection property is diffused. Titanium oxide, aluminum oxide, zinc oxide, lead carbonate, barium sulfate, calcium carbonate and the like may be used as the white pigment. In a case where metal powers are included, Ag powders having excellent reflectance may be included. Also, additionally, a separate fluorescent whitening agent may be further included.

Meanwhile, in the drawing, it is illustrated that a height of the light reflection unit 160 is identical with heights of the printed circuit board 160 and the resin layer 150. However, this is only one example. The height is not limited. For example, the height may be extended to a side of the diffusion plate 290 as necessary, or may be formed to be extended only to a side of the resin layer 150.

Also, it is illustrated that the light reflection unit 160 is perpendicular to a horizontal plane. However, this is only one example. As needed, the light reflection unit may be implemented in a shape in which the light reflection unit is inclined so as to form a predetermined angle to the horizontal plane.

The lighting device according to the present invention may further include a support unit 163 which surrounds an outer surface of the light reflection unit 160 and a lower part of the surface light-emitting unit X as illustrated in FIGS. 13 to 16. The support unit 163 functions to support and protect each configuration of the lighting device. Its material is not limited. For example, the support unit 163 may be composed of a metal material or a plastic material. Also, it may be formed of a material having fixed flexibility. Thus, by further forming the support unit 163, the surface light-emitting unit X and the indirect radiation unit Y may be safely sealed, thereby improving durability and reliability of the lighting device.

Figure 17:
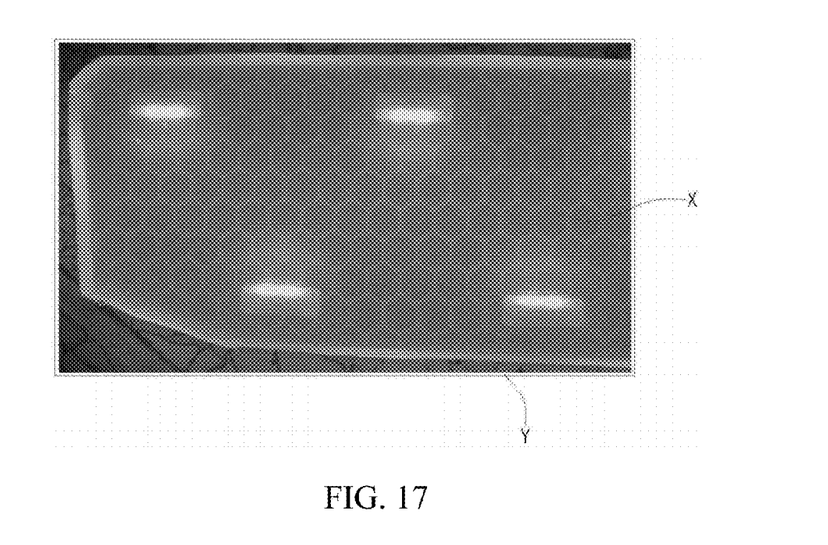
FIG. 17 is an image illustrating a real operation state of the lighting device according to the present invention.

FIG. 17 is an image illustrating a real operation state of the lighting device according to the present invention.

Referring to FIG. 17, it can be confirmed that the light irradiated from the light emitting unit of the surface light-emitting unit X is converted to the light emitted from the surface and is thus emitted to the outside. Also, it can be confirmed that a flare effect is generated from the indirect radiation unit Y as the light is scattered and is again reflected, and thus soft indirect light is emitted to the outside. That is, according to the present invention, indirect light having a fixed shape can be additionally realized without an additional light emitting unit. Also, the illumination effects of various designs can be achieved.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A lighting device, comprising:
    a printed circuit board;
    one or more light emitting units disposed on the printed circuit board;
    a resin layer which is disposed on the printed circuit board, in which the light emitting units are embedded;
    a light reflection unit disposed on a side surface of the resin layer and a side surface of the printed circuit board; and
    a reflection member disposed between the printed circuit board and the resin layer, wherein the light emitting units are arranged in one or more openings of the reflection member.

2. The lighting device of claim 1, wherein the light reflection unit is formed of a material including a white pigment or a metal.

3. The lighting device of claim 1, wherein the light reflection unit is formed in a structure in which the light reflection unit is directly adhered to the resin layer, or a structure in which the light reflection unit is adhered to the resin layer using an adhesive material.

4. The lighting device of claim 1, further comprising a light reflection unit supporting unit which is disposed on an outer surface of the light reflection unit.

5. The lighting device of claim 1, further comprising an indirect radiation unit which is disposed to be spaced apart from the resin layer and scatters and reflects light irradiated from the light emitting units.

6. The lighting device of claim 1, wherein the resin layer comprises an ultraviolet curing resin including an oligomer.

7. The lighting device of claim 6, wherein the oligomer comprises material selected from urethane acrylate, epoxy acrylate, polyester acrylate, and acrylic acrylate.

8. The lighting device of claim 1, wherein the printed circuit board comprises a flexible printed circuit board.

9. The lighting device of claim 1, wherein the light emitting units comprises side view type light emitting diodes.

10. The lighting device of claim 1, further comprising a diffusion plate on the resin layer, wherein a first air gap is formed between the resin layer and the diffusion plate.

11. The lighting device of claim 1, wherein a reflection pattern is disposed on the reflection member.

12. The lighting device of claim 1, further comprising an optical pattern layer disposed on the resin layer and diffuses light of the light emitting units.

13. The lighting device of claim 12, wherein the optical pattern layer comprises:
    a first optical sheet disposed on an upper surface of the resin layer;
    a second optical sheet disposed on the first optical sheet; and
    an optical pattern disposed between the first and second optical sheets for shielding or reflecting the light.

14. The lighting device of claim 13, wherein the optical pattern is formed in a structure in which a diffusion pattern including one or more materials selected from $TiO_2$, $CaCO_3$, $BaSO_4$, $Al_2O_3$, and silicon overlaps with a light shielding pattern including Al or a mixture of Al and $TiO_2$.

15. A lighting device, comprising:
    a printed circuit board;
    one or more light emitting units disposed on the printed circuit board;
    a resin layer formed on the printed circuit board, in which the light emitting units are embedded;
    a reflection member disposed between the printed circuit board and the resin layer; and
    an indirect radiation unit to be spaced apart from the resin layer and that scatters and reflects light irradiated from the light emitting units;
    wherein the light emitting units are arranged in one or more openings of the reflection member; and wherein the indirect radiation unit comprises a light reflection unit disposed at a side of the resin layer, and an indirect radiation air gap disposed between the side of the resin layer and the light reflection unit.

16. The lighting device of claim 15, wherein the light reflection unit is formed of a material including a white pigment or a metal.

17. A lighting device, comprising:
a printed circuit board;
one or more light emitting units disposed on the printed circuit board;
a resin layer disposed on the printed circuit board, in which the light emitting units are embedded;
a supporting unit disposed at an outer surface of the resin layer and a lower surface of the printed circuit board; and
a reflection member disposed between the printed circuit board and the resin layer.

18. The lighting device of claim 17, wherein the supporting unit is formed of a plastic material.

19. A lighting device, comprising:
a printed circuit board;
one or more light emitting units which are formed on the upper surface of the printed circuit board for emitting a light to a lateral direction extended along with the upper surface of the printed board and which are arranged in a zigzag shape for emitting the light to facing directions of the lateral direction;
a resin layer disposed on the printed circuit board, in which the light emitting units are embedded; and
a light reflection unit disposed on a side surface of the resin layer and a side surface of the printed circuit board.

20. The lighting device of claim 19, further comprising a spaced space between the resin layer and the light reflection unit, wherein the light reflection unit and the spaced space scatter and reflect light irradiated from the light emitting units for forming an indirect light source on one or more side surfaces of the resin layer.

* * * * *